United States Patent
Moon (10) Patent No.: US 7,838,181 B2
(45) Date of Patent: Nov. 23, 2010

(54) PHOTO MASK AND METHOD FOR MANUFACTURING SEMICONDUCTOR DEVICE USING THE SAME

(75) Inventor: Jae In Moon, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 275 days.

(21) Appl. No.: 12/116,684

(22) Filed: May 7, 2008

(65) Prior Publication Data

US 2009/0142674 A1    Jun. 4, 2009

(30) Foreign Application Priority Data

Nov. 29, 2007    (KR) .................... 10-2007-0122952

(51) Int. Cl.
*G03F 1/00*    (2006.01)

(52) U.S. Cl. ............................. 430/5; 716/19

(58) Field of Classification Search .................. 430/5, 430/311–313; 716/19, 21; 355/53
See application file for complete search history.

(56) References Cited

U.S. PATENT DOCUMENTS

| | | | |
|---|---|---|---|
| 6,635,549 B2 * | 10/2003 | Kyoh et al. ................ | 430/5 |
| 7,718,323 B2 * | 5/2010 | Lee ............................. | 430/5 |
| 2005/0026047 A1 * | 2/2005 | Yang .......................... | 430/5 |
| 2006/0199084 A1 * | 9/2006 | Word ......................... | 430/5 |
| 2006/0269848 A1 * | 11/2006 | Setta ......................... | 430/5 |
| 2007/0174802 A1 * | 7/2007 | Shin et al. .................. | 716/8 |
| 2008/0315323 A1 * | 12/2008 | Moon ....................... | 257/390 |
| 2009/0233183 A1 * | 9/2009 | Moon ......................... | 430/5 |

FOREIGN PATENT DOCUMENTS

| | | |
|---|---|---|
| JP | 07-248612 | 9/1995 |
| JP | 2005-310965 | 11/2005 |

OTHER PUBLICATIONS

Notice of Rejection for Korean Application No. 10-2007-0122952, dated Apr. 29, 2009.

* cited by examiner

*Primary Examiner*—Mark F Huff
*Assistant Examiner*—Stewart A Fraser
(74) *Attorney, Agent, or Firm*—Marshall, Gerstein & Borun LLP (57) ABSTRACT

A photo mask includes a dot pattern formed between a line pattern and an island pattern. Methods of making a semiconductor device employing such a photo mask improves yield and productivity of the device.

16 Claims, 14 Drawing Sheets

PHOTO MASK AND METHOD FOR MANUFACTURING SEMICONDUCTOR DEVICE USING THE SAME

CROSS-REFERENCE TO RELATED APPLICATION

The priority of Korean patent application No. 10-2007-0122952, filed Nov. 29, 2007, the disclosure of which is incorporated by reference in its entirety, is claimed.

BACKGROUND OF THE INVENTION

1. Field of the Invention

The invention generally relates to a photo mask and a method for manufacturing a semiconductor device using the same. More specifically, the invention relates to semiconductor manufacturing technology utilizing an asymmetric illuminator that can prevent the occurrence of a necking phenomenon at a connecting portion of two patterns during a photolithography process.

2. Brief Description of Related Technology

Semiconductor devices and integrated circuits are becoming more highly-integrated. As a result, research is on-going to improve characteristics of these devices and circuits, and to secure desirable process margins. In semiconductor memory devices, as the memory capacity of such devices increases, a critical dimension of patterns in the device is reduced. As a result, photolithography processes for forming a pattern over a wafer are important in a microlithography process.

Figure 1:
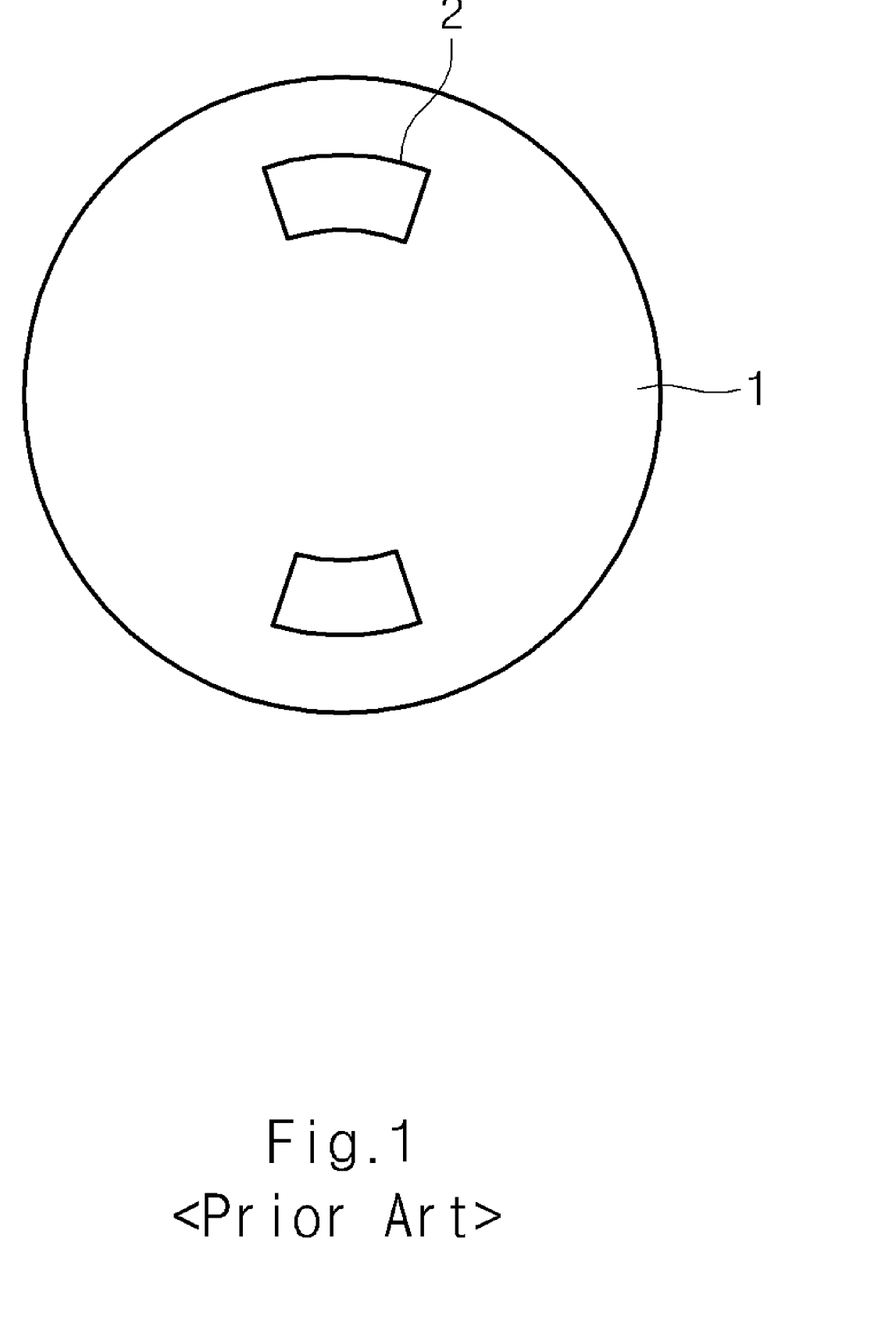
FIG. 1 is a plane diagram illustrating a general dipole illuminator.

Resolution enhancement technology has been widely used in photolithography as the pattern size of semiconductor devices becomes smaller and as new structures for semiconductor devices are developed. In one of the resolution enhancement technologies, an asymmetric illuminator (e.g., a dipole illuminator) is used in the photolithography process. When a dipole illuminator is introduced, a line and space can be formed to be finer. FIG. 1 is a plane diagram illustrating a general dipole illuminator. Generally, the dipole illuminator comprises a light protection region 1 having a circular shape and a pair of floodlight units 2 facing each other in a direction X or Y. Since the dipole illuminator is directional, a pattern obtained by performing an exposure process using the dipole illuminator has a resolution increased toward one direction but decreased toward the other direction. In other words, when the floodlight unit 2 is disposed in the direction Y, as shown in the dipole illuminator of FIG. 1, a pattern of the direction X has an increased resolution but a pattern of the direction Y has a decreased resolution.

Figure 2:
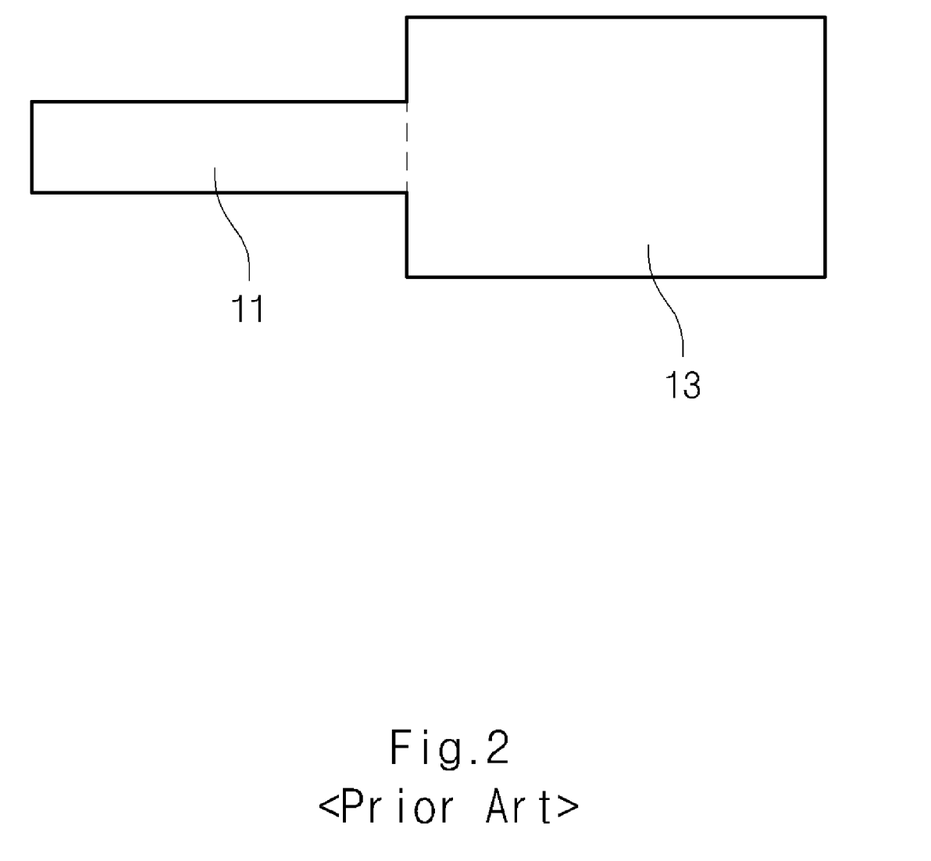
FIGS. 2 and 3 are plane diagrams illustrating a conventional photo mask.

FIG. 2 is a diagram illustrating a conventional photo mask. As shown in FIG. 2, a line pattern 11 is connected to one side of an island pattern 13 in the photo mask. A critical dimension (CD) of the island pattern 13 is three times larger than that of the line pattern 11. For example, while the island pattern 13 is a contact pad formed in a peripheral circuit unit, the line pattern 11 is a conductive line (i.e., a word line, a bit line, or a metal line) connected to a cell unit.

Figure 3:
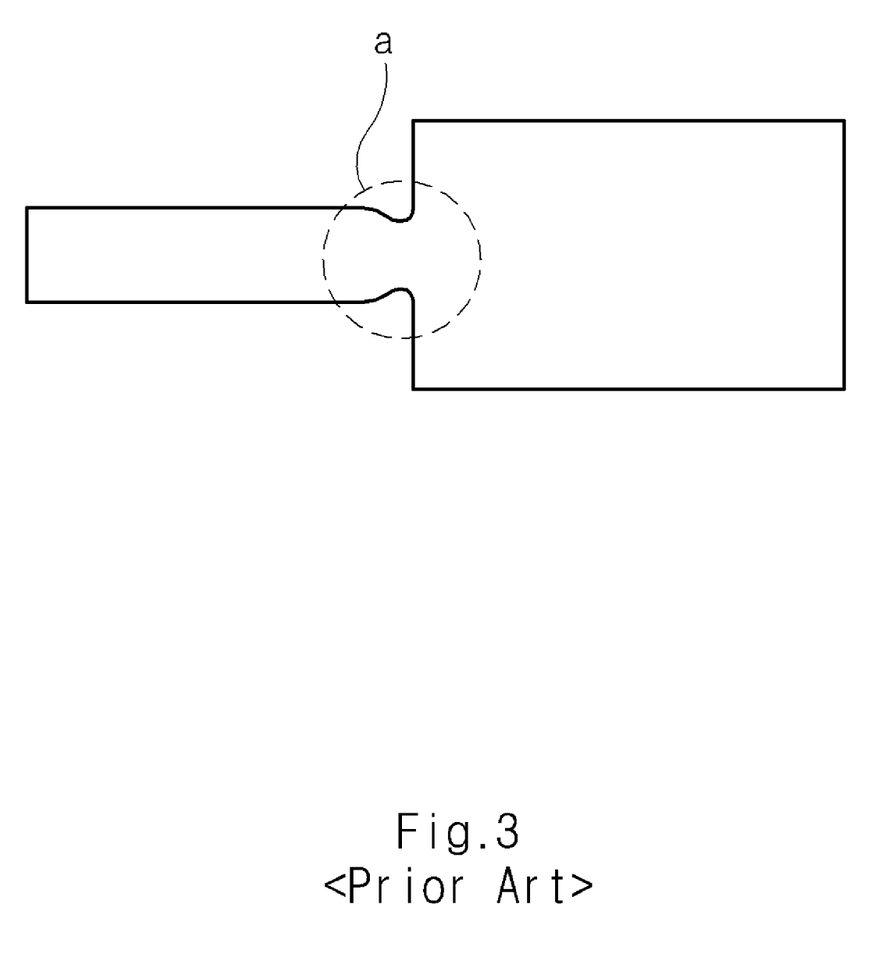

FIG. 3 is a plane diagram illustrating a pattern formed over a semiconductor substrate by photolithography with the photo mask of FIG. 2. As shown in FIG. 3, a necking phenomenon a (and shown within the region defined by the dashed circle) occurs at a portion where the line pattern 11 is connected to the island pattern 13 of FIG. 2.

Figure 4:
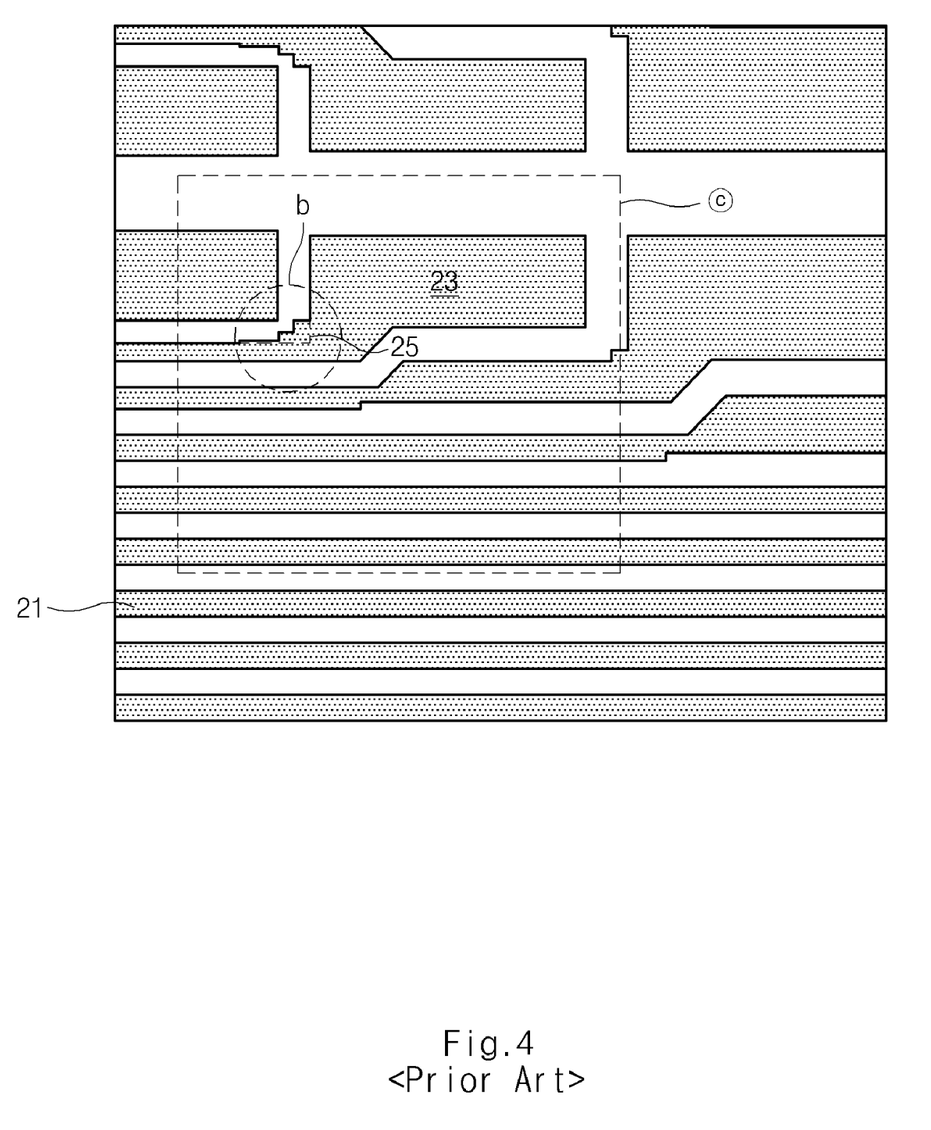
FIGS. 4 through 6 are diagrams illustrating the photo mask of FIG. 2 and its simulation results.
Figure 5:
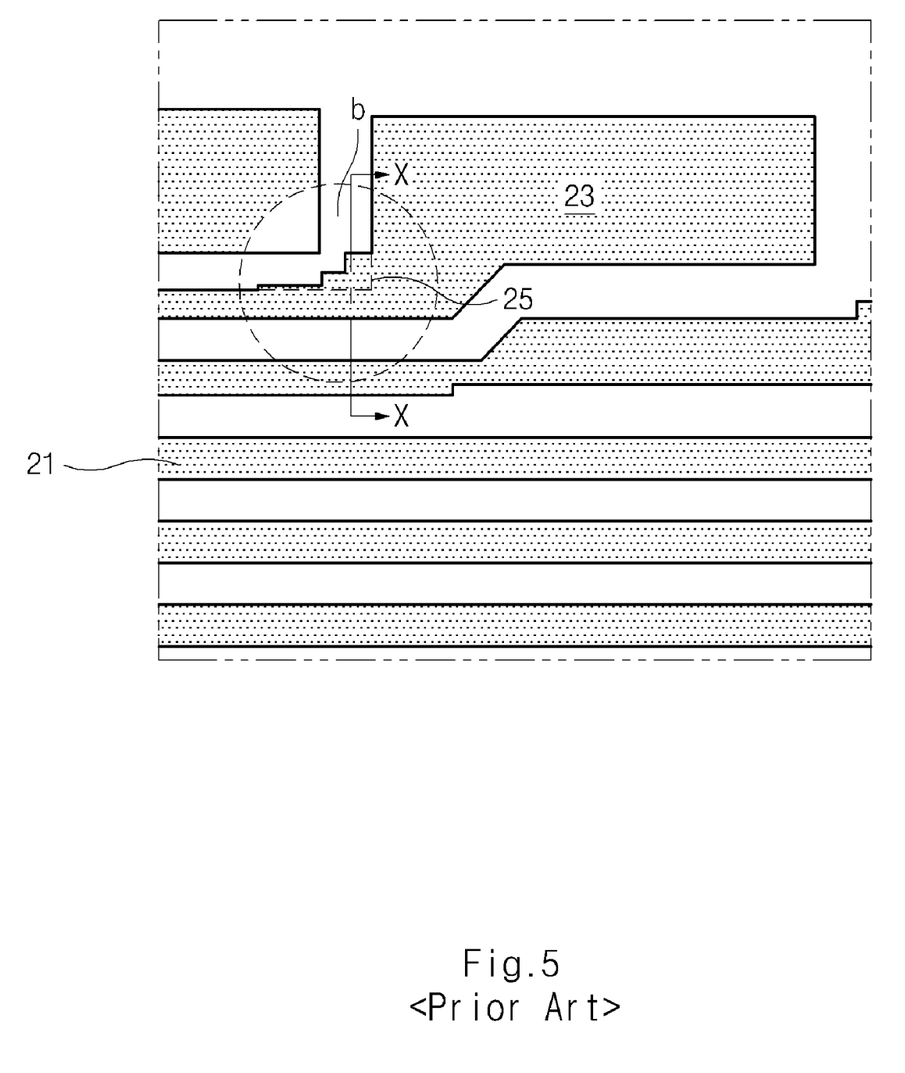
Figure 6:
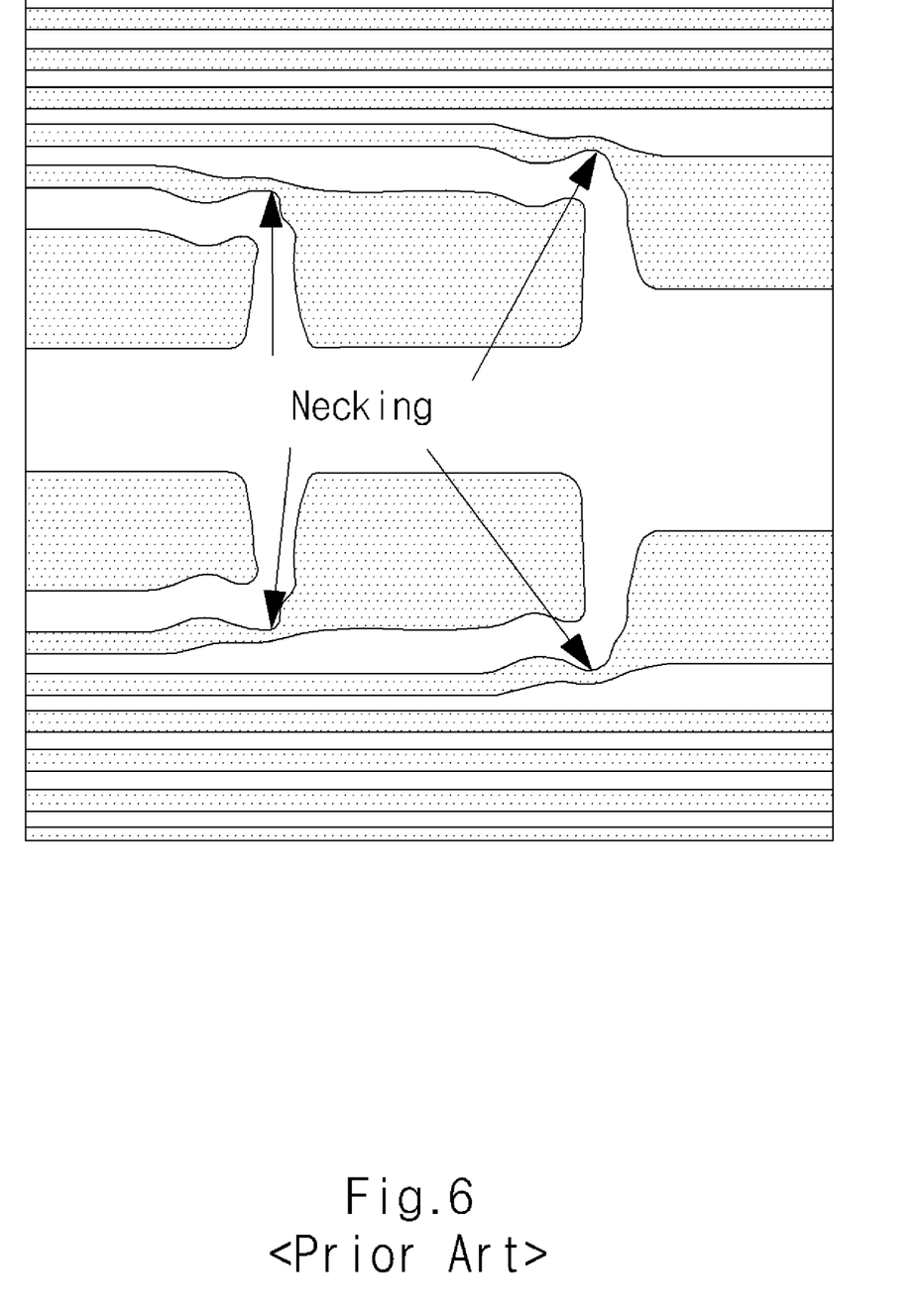

FIGS. 4 to 6 illustrate the photo mask of FIG. 2 and its simulation results. Referring to FIGS. 4 and 5, a plurality of line patterns 21 and a plurality of island patterns 23 are formed on a substrate of the photo mask. The line patterns 21 are connected to the island patterns 23.

In general, the island pattern 23 is a contact pad, and the line pattern 21 is a conductive line. The contact pad has a CD three times larger than that of the conductive line. The line pattern 21 and the island pattern 23 may together form a test pattern. To prevent the necking phenomenon (shown in FIG. 3), optical proximity correction (OPC) is performed at the connecting portion (shown within the region "b" defined by the dashed circle in FIG. 4) of the line pattern 21 and the island pattern 23. FIG. 5 is a more detailed illustration of region "c" (defined by the dashed square) of FIG. 4. As shown in region "c" of FIG. 5, a dashed line 25 represents a pattern layout before the OPC.

A method for forming a photo mask using the layout of FIG. 4 includes: forming a shading film over a quartz substrate; covering the shading film with an electric beam photoresist film; exposing and developing the photoresist film with an electron gun programmed according to the layout of FIG. 4 to form a photoresist pattern; and etching the shading film with the photoresist pattern as a mask, and removing the photoresist pattern to obtain the photo mask.

The OPC is performed on all necessary parts as well as the connecting portion of the line pattern 21 and the island pattern 23.

FIG. 6 is a plane diagram illustrating a pattern formed over the semiconductor substrate by photolithography with the photo mask of FIG. 4. As shown in FIG. 6, the necking phenomenon occurs at portions where the line patterns and the island patterns connect.

Figure 7:
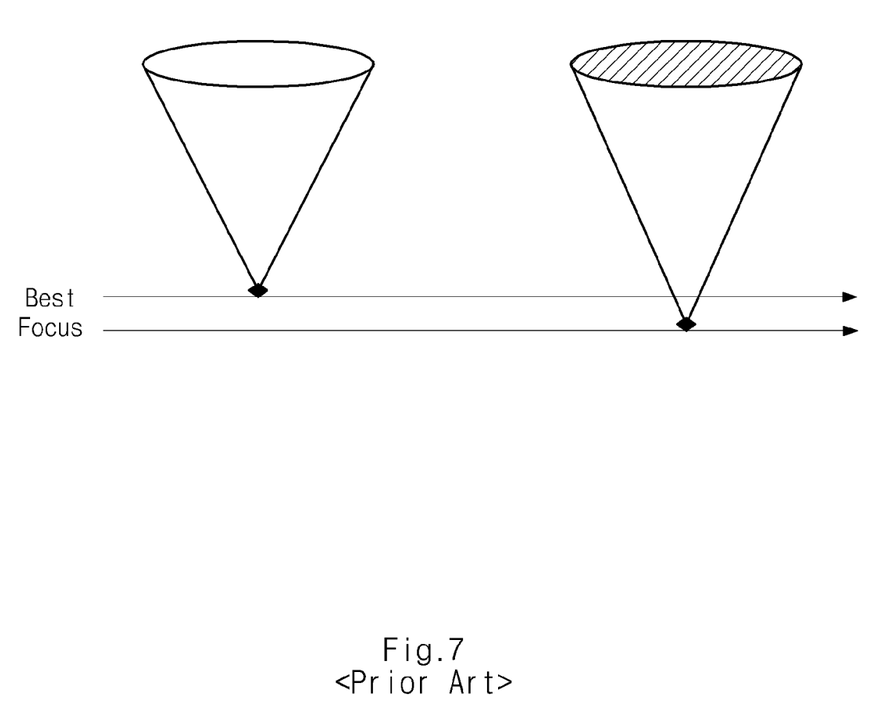
FIG. 7 is a diagram illustrating change of depth of focus (DOF)

FIG. 7 is a diagram illustrating change of depth of focus (DOF) due to other factors than those of FIG. 2 to 6. As shown in FIG. 7, continuous photolithography heats the lens and, thereby undesirably alters the lens refraction and undesirably changes the best focus of the lens. As a result, the DOF is changed. In FIG. 7, the image on the left shows the best focus before lens heating, and the image on the right shows the best focus after lens heating. As shown by these images, the best focus has drifted. The drift causes a shortening, resulting from the necking phenomenon of FIG. 8 and a bridge between neighboring patterns. The change of the best focus may cause the problems illustrated in FIGS. 2 to 6.

The conventional photo mask and the conventional method for manufacturing a semiconductor device using the conventional photo mask cause a necking phenomenon between two patterns each having a different CD by three times or more, and also bring about a shortening of the two patterns and a bridge between other neighboring patterns, thereby degrading productivity and yield of the semiconductor device.

SUMMARY OF THE DISCLOSURE

Disclosed herein are various embodiments of a photo mask that prevent a necking phenomenon at a connecting portion between patterns each having a different CD (by about three times or more, for example). Also disclosed herein are various methods for manufacturing a semiconductor device using the photo mask.

According to one embodiment, a photo mask includes a first pattern, a second pattern, and one or more dot patterns disposed between the first and second patterns. The first pattern and the second pattern preferably have a CD difference by about 3 to about $10^4$ times. Preferably each of the first and second patterns is one of a line pattern and an island pattern. Preferably the line and island patterns together form a test pattern. Each of the first pattern and the second pattern preferably is one of a conductive line and a pad. Preferably, the number of the dot patterns formed between the first pattern and the second pattern ranges from 2 to 30. A dot pattern preferably is longer as the dot pattern approaches (i.e., moves closer in proximity) to the second pattern. Preferably, a distance between the dot patterns is more than 0 and less than 1F (provided 1F is the minimum width where a pattern can be formed by a photolithography). Each of the dot patterns preferably has a length that is the same as or larger than a smaller value of CDs of the first pattern and the second pattern, and a distance between the neighboring dot patterns preferably is formed smaller than 1F. Preferably the photo mask is used in photolithography using an asymmetric illuminator. The photo mask preferably is one of a binary mask and a phase inversion mask. A shading film of the binary mask preferably includes a chrome film. The phase inversion mask preferably has a multi layer structure of a phase inversion layer and a chrome film or a single layer structure of a phase inversion layer.

According to another embodiment, a method for fabricating a semiconductor device includes forming an underlying layer over a semiconductor substrate, forming a photoresist layer on the underlying layer, and covering the photoresist layer with the aforementioned photo mask. The method also includes exposing and developing the photoresist layer to form a photoresist pattern. The method also includes etching the underlying layer, with the photoresist pattern as a etching mask, and removing the photoresist pattern to form an underlying layer pattern.

The exposing step preferably is performed with an asymmetric illuminator.

Additional features of the disclosed embodiments may become apparent to those skilled in the art from a review of the following detailed description, taken in conjunction with the drawings, and the appended claims.

BRIEF DESCRIPTION OF THE DRAWINGS

For a more complete understanding of the disclosure, reference should be made to the following detailed description and accompanying drawings wherein.

While the disclosed photo mask and method are susceptible of embodiments in various forms, there are illustrated in the drawings (and will hereafter be described) specific embodiments, with the understanding that the disclosure is intended to be illustrative, and is not intended to limit the invention to the specific embodiments described and illustrated herein.

DETAILED DESCRIPTION OF THE PREFERRED EMBODIMENTS

FIGS. 9a to 9e are diagrams illustrating embodiments of the inventive photo mask. Each of the photo masks includes dot patterns 45 disposed between two patterns (first pattern 41 and second pattern 43, 44) having a different CD by three times or more. Other peripheral patterns are not shown in the FIGS. 9a to 9e for the convenience of explanation.

The second pattern 43 has a CD at least about three times larger than that of the first pattern 41, preferably by about 3 to about $10^4$ times, in an extended direction of the first pattern 41. The size and the number of the dot pattern 45 may be adjusted depending on location and shape of peripheral patterns. However, the number of the dot patterns 45 formed between the first pattern 41 and the second pattern 43 preferably ranges from about 2 to about 30.

A distance "S" between the dot patterns 45 is formed smaller than the minimum width (F) which can be patterned by a lithography process. In the illustrated embodiment, the distance "S" is more than 0 and less than 1F. A width "W" of the dot patterns 45 may be formed identical to or larger than the distance "S" between the dot patterns. Preferably the width "W" is about 2 to about 10 times larger than the distance "S."

A distance between dot pattern 45 and other upper pattern or other lower pattern is formed to be 1F or more.

Figure 9A:
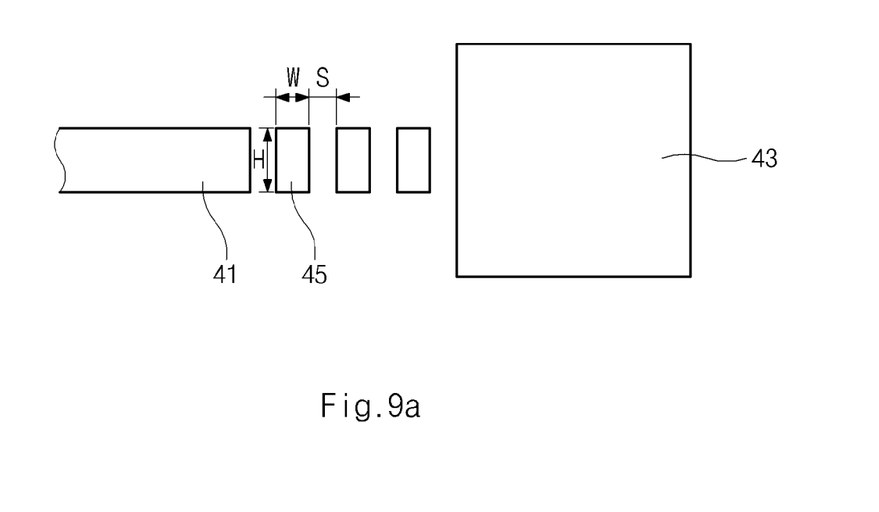
FIGS. 9a to 9e and FIG. 10 are diagrams illustrating a photo mask according to an embodiment of the invention.

FIG. 9a shows dot patterns 45 formed between a line pattern 41 as the first pattern and an island pattern 43 as the second pattern. A width "W" of the dot pattern 45 is set to be 1F, and a distance "S" between the dot patterns 45 is set to be less than 1F. The line pattern 41 represents a conductive line, and the island pattern 43 represents a pad.

Figure 9B:
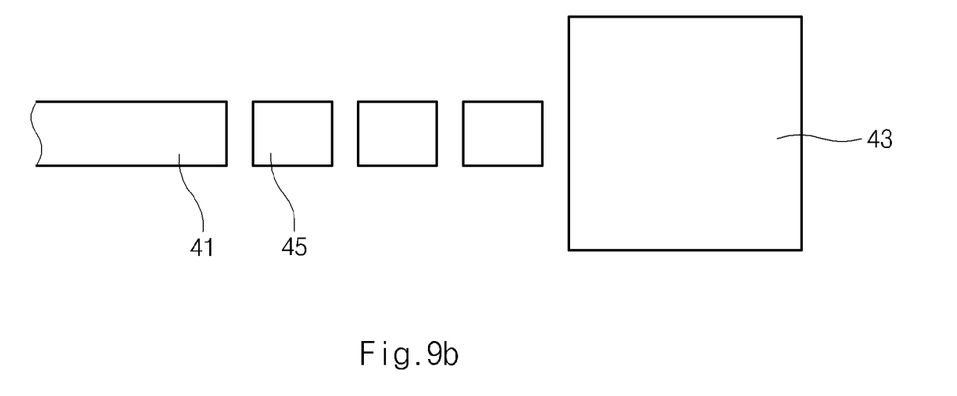

FIG. 9b shows when the width of the dot pattern 45 is set to be 3F and the distance of the dot pattern 45 is set to be less than 1F.

Figure 9C:
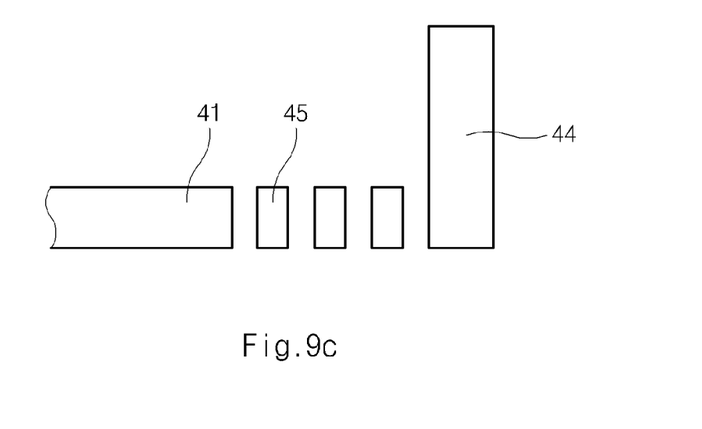

FIG. 9c shows when the second pattern is a line pattern 44 formed to be extended toward a direction (e.g., vertical direction) other than the longitudinal direction of the line pattern 41 and has a length at least about three times greater than the CD of the line pattern 41. Like the FIG. 9c, the line pattern 44 other than the island pattern can be used as the second pattern.

Figure 9D:
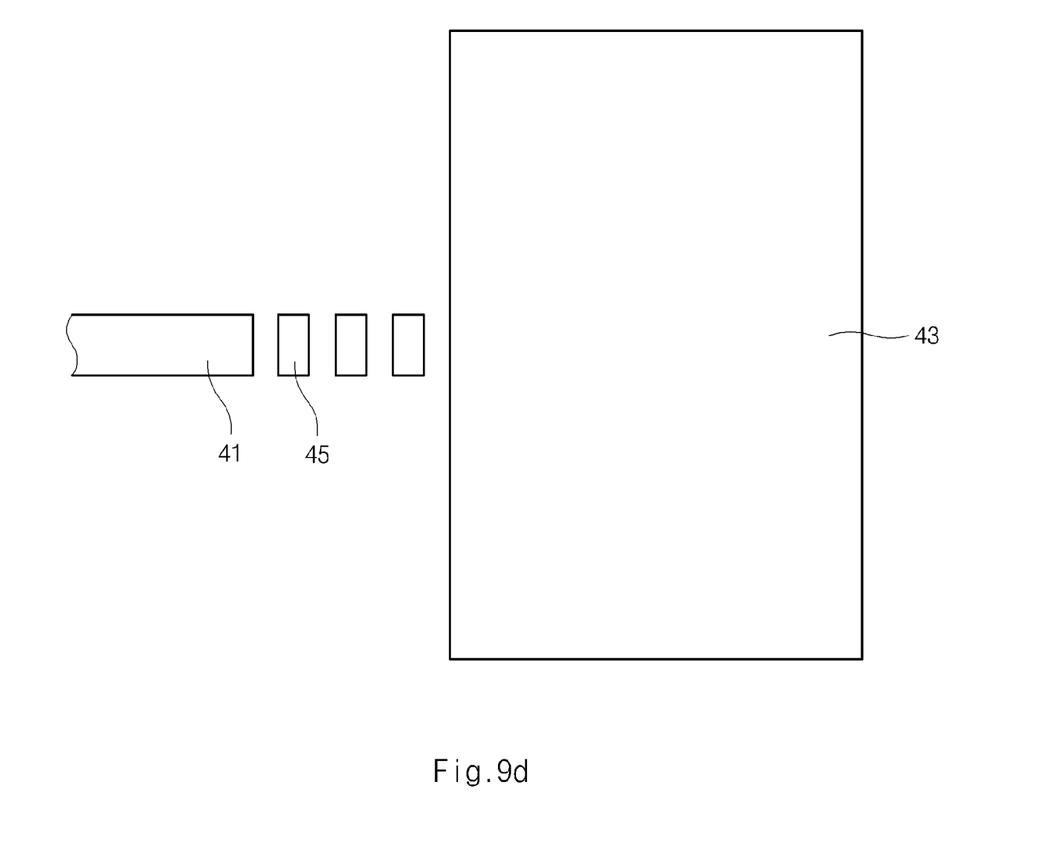

FIG. 9d shows when the second pattern is a test pattern formed to have a CD of $10^4$F.

Figure 9E:
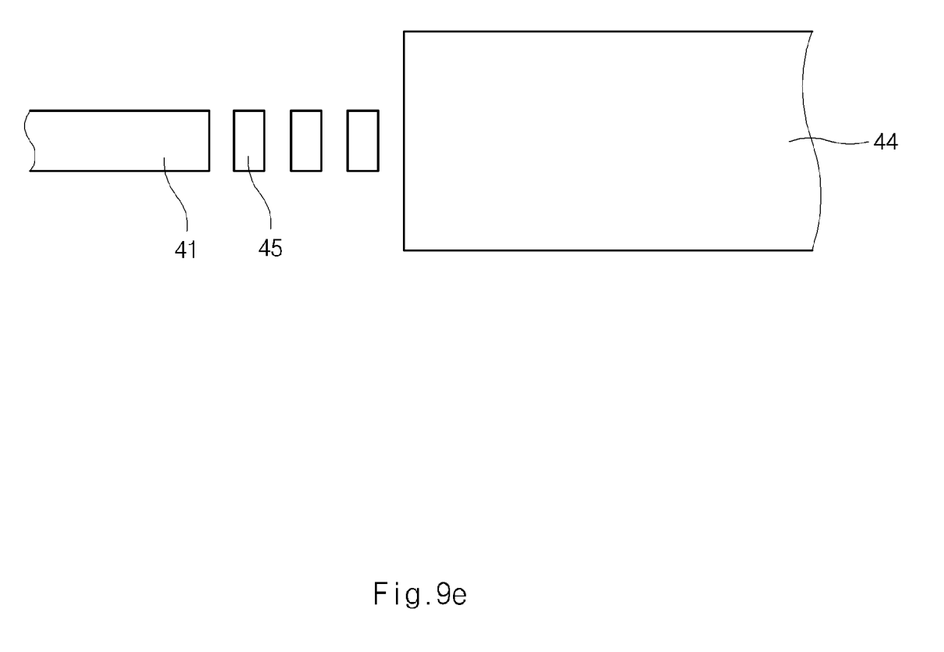

FIG. 9e shows when the second pattern is a line pattern 44 formed to be extended in the same direction as that of the first pattern 41 and is a conductive line having a CD of 3F.

Although the dot pattern 45 is formed to have the same CD as that of the first pattern in FIGS. 9a to 9e, the invention is not limited by the depictions in these figures. A length "H" of the dot patterns 45 is the same as or greater than the smaller value of CDs of the first and second patterns, and can be different depending on its location. For example, as shown in FIG. 10, the length "H" can be gradually increased as it approaches (i.e., moves closer to) the second pattern (e.g., as portions of the dot pattern move closer to the pad).

Figure 10:
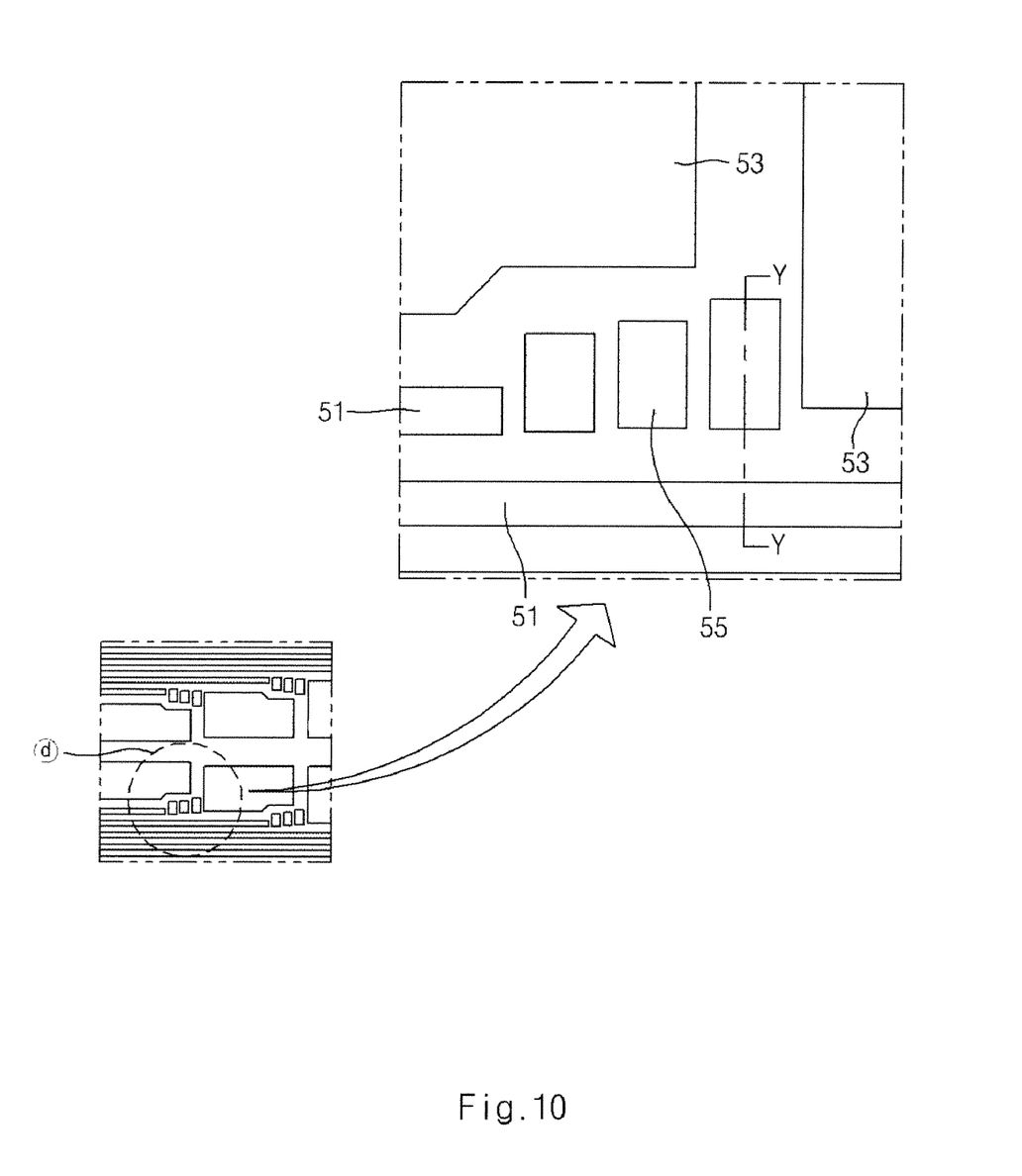

FIG. 10 shows, in enlarged form, region "d" of the photo mask, the region including a line pattern as the first pattern and an island pattern as the second pattern of FIGS. 9a to 9e. The region "d" shown in FIG. 10 corresponds to region "b" of FIG. 5.

Referring to FIG. 10, a dot pattern 55 is formed between a line pattern 51 as the first pattern and an island pattern 53 as the second pattern. The island pattern 53 is a contact pattern, and the line pattern 51 is a conductive line. The island pattern 53 has a CD larger than that of the line pattern 51 by three times or more, preferably by about 3 to about $10^4$ times. As shown in FIGS. 9c and 9e, a line pattern can be formed instead of the island pattern 53.

The size and the number of a dot pattern 55 may be adjusted depending on location and shape of peripheral patterns. However, the number of the dot patterns 55 formed between the first and second patterns preferably ranges from about 2 to about 10.

The photo mask of FIG. 10 may be a binary mask including a chrome film. And the photo mask may be a phase inversion mask having a multi layer structure of a phase inversion layer and a chrome film, or a single layer structure of a phase inversion layer as a shading film.

A method of forming the photo mask, for example, the photo mask shown in FIG. 10, includes forming a shading film over a quartz substrate. The shading film preferably includes a chrome film. The method also includes covering the shading film with an electric beam photoresist film. As shown in FIGS. 9 and 10, an electric gun is programmed according to the layout, the layout including the dot pattern formed between the line and island patterns. The method also includes exposing and developing the photoresist film to form a photoresist pattern. The method further includes etching the shading film, with the photoresist pattern as a mask, to form a shading pattern, and removing the residual photoresist pattern to obtain the photo mask.

The photo mask includes a dot pattern formed between a line pattern and an island pattern. The island pattern has a CD at least about three times larger than that of the line pattern, and preferably by more than three times and $10^4$ times or less.

A method for manufacturing a semiconductor device includes forming an underlying layer over a semiconductor substrate, and forming a photoresist layer on the underlying layer. The underlying layer preferably includes a lower structure formed over the semiconductor substrate. A hard mask layer may be formed before the underlying layer is formed. The method also includes covering the photoresist layer with a photo mask. The photo mask includes first and second patterns and a dot pattern disposed between the first and second patterns. An example of a suitable photo mask is shown in FIG. 10. The method also includes exposing and developing the photoresist layer to form a photoresist pattern on the underlying layer. The photolithography (e.g., the exposing step) preferably is performed with an asymmetric illuminator. The asymmetric illuminator preferably is a dipole illuminator.

The semiconductor device manufacturing method also includes etching the underlying layer, with the photoresist pattern as a mask, and removing the residual photoresist pattern to form an underlying layer pattern.

Figure 8:
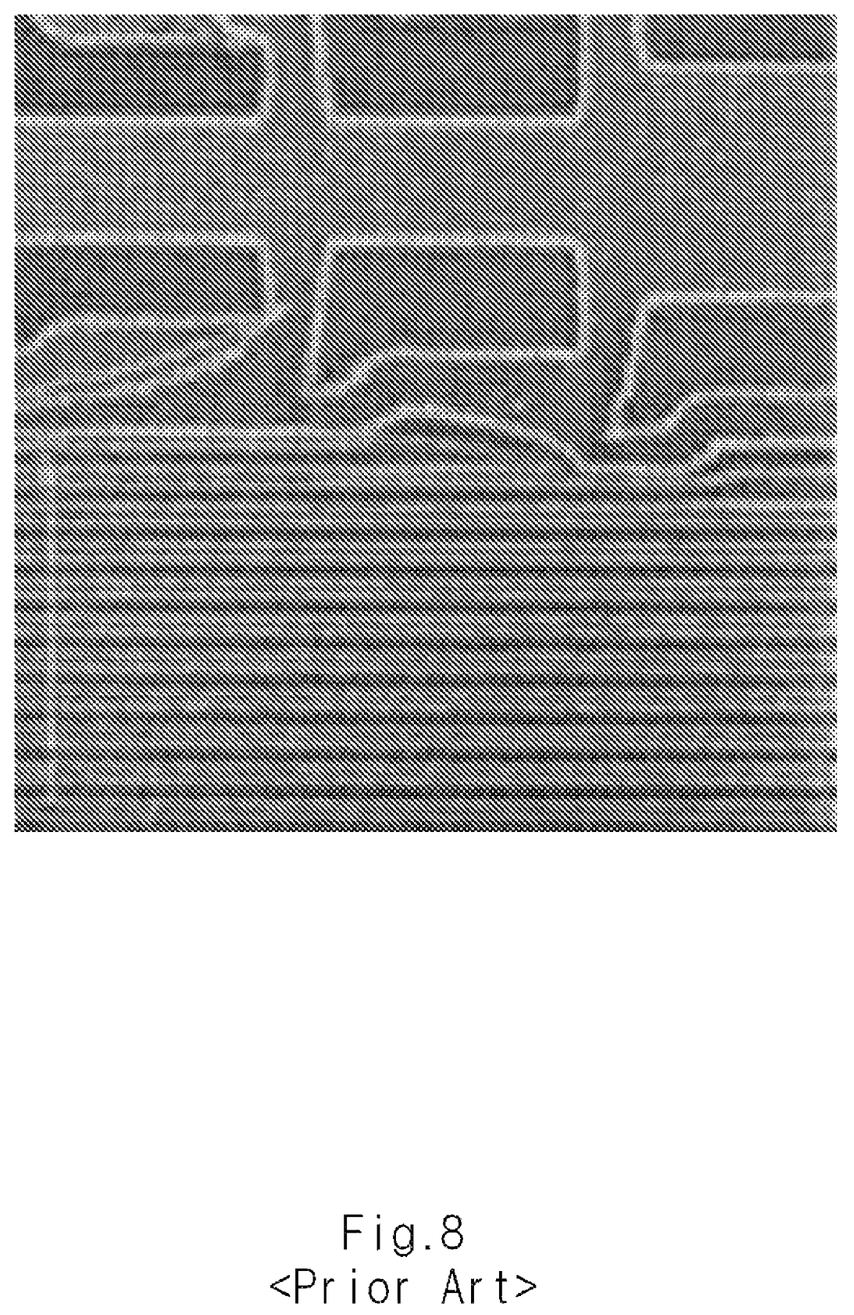
FIG. 8 is a photograph illustrating the change of DOF of FIG. 7.
Figure 11:
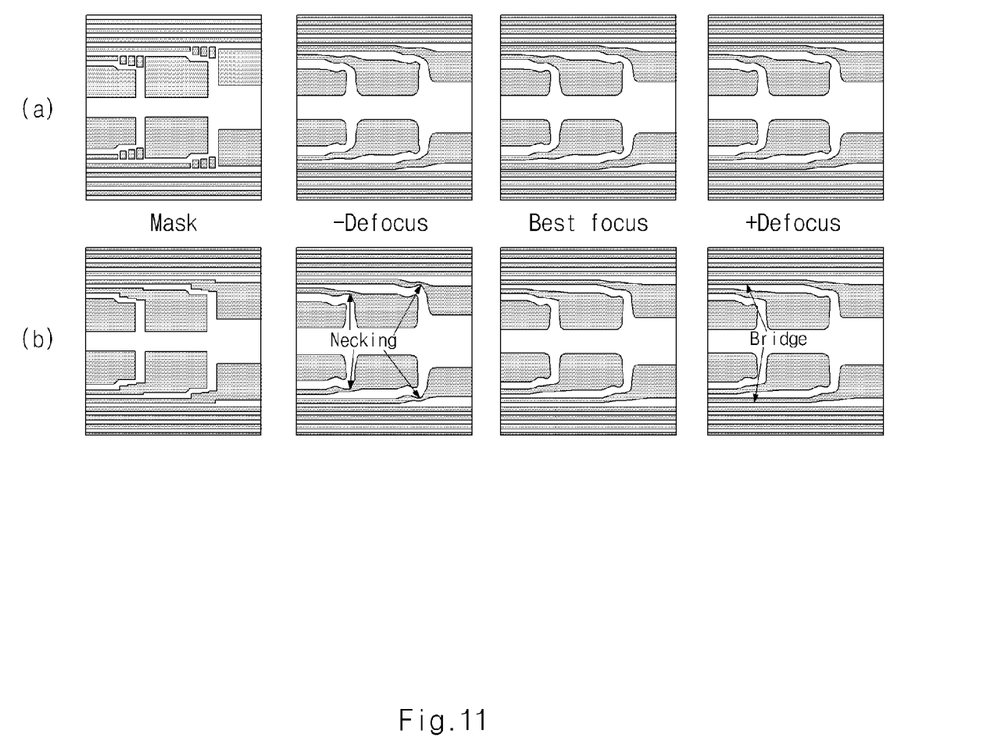
FIGS. 11A and 11B are diagrams illustrating a comparison between a conventional photo mask (as shown in FIG. 11B) and a photo mask according to an embodiment of the invention (as shown in FIG. 11A).

FIG. 11 is a diagram illustrating a comparison between a conventional photo mask and a photo mask according to an embodiment of the invention. FIG. 11(a) shows simulation results of the embodiment of the invention, and FIG. 11(b) shows simulation results of the conventional art. Referring to FIG. 11(a), when a dot pattern is formed between a line pattern and an island pattern in the embodiment of the invention, a necking or a bridge phenomenon is not generated, although defocus occurs in the photolithography. The defocus can be generated by an incorrect DOF. As noted above, continuous photolithography can undesirably change lens refraction to alter the DOF, thereby generating the defocus. Referring to FIG. 11(b), the conventional art causes a necking or bridge phenomenon in generation of defocus. However, as shown in FIG. 11(a), a necking or bridge phenomenon is not generated between a line pattern as a first pattern and an island pattern as a second pattern, although the defocus is generated by change in lens refraction (due to the continuous photolithography). As a result, the necking and bridge phenomenon can be prevented even when the best focus is changed by lens heating, as shown in FIGS. 7 and 8.

Figure 12:
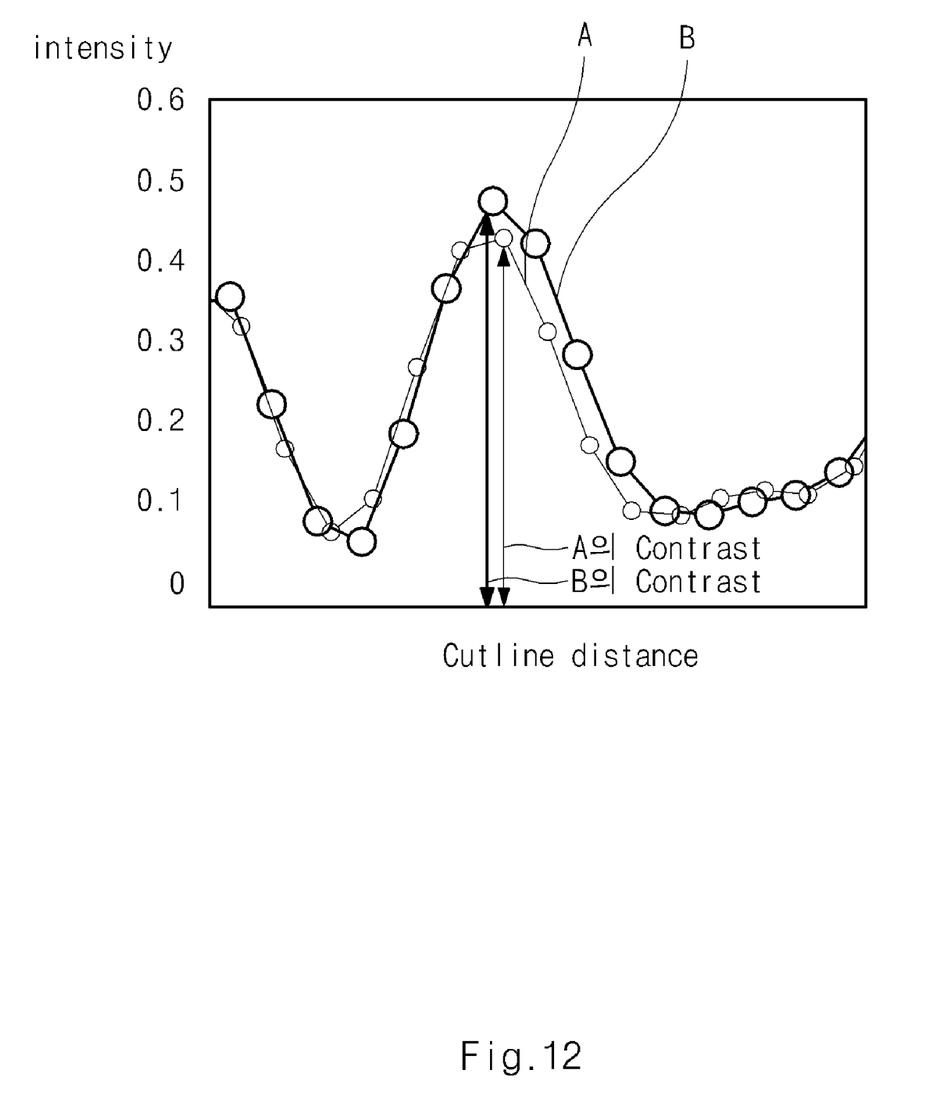
FIG. 12 is a graph illustrating pattern contrast between a conventional photo mask and a photo mask according to an embodiment of the invention.

FIG. 12 is a graph that shows resolution taken along a cross-section of the dot pattern (region "d" of FIG. 10) and a cross-section of the OPC pattern (region "b" in FIGS. 4 and 5). The measured contrast ("B") of the conventional art is taken along line X-X of FIG. 5, and the measured contrast ("A") of the invention is taken along line Y-Y of FIG. 10.

Referring to FIG. 12, the contrast "A" is shown to be lower than contrast "B" of the conventional art between the line pattern (as the first pattern) and the island pattern (as the second pattern). In the invention, a resolution of the dot pattern is lowered to reduce the change amount even when a focus is changed, so that the invention is less sensitive to the focus change. As a result, a necking or bridge phenomenon of the pattern resulting from defocus can be prevented.

As described above, the invention includes forming a dot pattern between a line pattern and an island pattern, thereby preventing a necking and bridge phenomenon. Also, the invention increases a DOF margin to prevent a necking or bridge phenomenon in case of defocus of a photolithography, thereby improving yield and productivity of the semiconductor device.

The above embodiments of the invention are illustrative and not limitative. Various alternatives and equivalents are possible. The invention is not limited by the type of deposition, etching polishing, and patterning steps described herein. Nor is the invention limited to any specific type of semiconductor device. For example, the invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A photo mask comprising:
    a first pattern;
    a second pattern having a critical dimension (CD) larger than a CD of the first pattern;
    and a plurality of dot patterns disposed between the first pattern and the second pattern, wherein each of the dot patterns has a length that increases as the dot patterns approach the second pattern and that is the same as or larger than a smaller value of the CDs of the first and second patterns.

2. The photo mask according to claim 1, wherein the first pattern and the second pattern have a CD difference of about 3 to about $10^4$ times.

3. The photo mask according to claim 1, wherein each of the first and second patterns is one of a line pattern and an island pattern.

4. The photo mask according to claim 3, wherein the line pattern and the island pattern taken together form a test pattern.

5. The photo mask according to claim 1, wherein each of the first and second patterns is one of a conductive line and a pad.

6. The photo mask according to claim 1, wherein the number of the dot patterns formed between the first and second patterns ranges from about 2 to about 30.

7. The photo mask according to claim 1, wherein a distance between the dot patterns is greater than 0 and less than 1F, wherein 1F is the minimum width capable of being formed by photolithography.

8. The photo mask according to claim 1, wherein a distance between neighboring dot patterns is smaller than 1F, wherein 1F is the minimum width capable of being formed by photolithography.

9. The photo mask according to claim 1, wherein the photo mask is one of a binary mask and a phase inversion mask.

10. The photo mask according to claim 9, wherein a shading film of the binary mask comprises a chrome film.

11. The photo mask according to claim 9, wherein the phase inversion mask is a multi layer structure comprising a phase inversion layer and a chrome film, or is a single layer structure comprising a phase inversion layer.

12. A method for fabricating a semiconductor device, the method comprising:
   forming an underlying layer over a semiconductor substrate;
   forming a photoresist layer on the underlying layer;
   covering the photoresist layer with a photo mask of claim 1;
   exposing and developing the photoresist layer to form a photoresist pattern;
   etching the underlying layer, with the photoresist pattern as a etching mask; and,
   removing the photoresist pattern to form an underlying layer pattern.

13. The method according to claim 12, wherein the photo mask is one of a binary mask and a phase inversion mask.

14. The method according to claim 12, wherein the exposing step is performed with an asymmetric illuminator.

15. The method according to claim 12, wherein each of the first and second patterns is one of a line pattern and an island pattern.

16. The photo mask according to claim 12, wherein each of the first and second patterns is one of a conductive line and a pad.

* * * * *